United States Patent
Sperl et al.

(10) Patent No.: US 10,193,034 B2
(45) Date of Patent: Jan. 29, 2019

(54) SEMICONDUCTOR DEVICE, ILLUMINATING DEVICE, AND METHOD OF PRODUCING A SEMICONDUCTOR DEVICE

(71) Applicant: OSRAM Opto Semiconductors GmbH, Regensburg (DE)

(72) Inventors: Matthias Sperl, Mintraching (DE); Frank Singer, Regenstauf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/328,601

(22) PCT Filed: Jul. 8, 2015

(86) PCT No.: PCT/EP2015/065606
§ 371 (c)(1),
(2) Date: Jan. 24, 2017

(87) PCT Pub. No.: WO2016/015966
PCT Pub. Date: Feb. 4, 2016

(65) Prior Publication Data
US 2017/0222105 A1   Aug. 3, 2017

(30) Foreign Application Priority Data
Jul. 29, 2014   (DE) .................. 10 2014 110 719

(51) Int. Cl.
*H01L 33/00* (2010.01)
*G02F 1/1333* (2006.01)
(Continued)

(52) U.S. Cl.
CPC ............. *H01L 33/58* (2013.01); *H01L 33/486* (2013.01); *H01L 33/507* (2013.01); *H01L 33/54* (2013.01);
(Continued)

(58) Field of Classification Search
CPC . H01L 33/00; H01L 27/1218; H01L 23/5387; H01L 25/0657; H01L 25/50;
(Continued)

(56) References Cited

U.S. PATENT DOCUMENTS

| | | | | |
|---|---|---|---|---|
| 5,019,943 A | * | 5/1991 | Fassbender | ......... H01L 25/0657 257/777 |
| 2004/0106234 A1 | * | 6/2004 | Sorg | ..................... H01L 21/4846 438/123 |

(Continued)

FOREIGN PATENT DOCUMENTS

| | | |
|---|---|---|
| CN | 102576787 | 7/2012 |
| DE | 199 01 918 A1 | 7/1999 |

(Continued)

*Primary Examiner* — Galina Yushina
(74) *Attorney, Agent, or Firm* — DLA Piper LLP (US)

(57) ABSTRACT

A semiconductor device includes a semiconductor chip including an active region provided to generate radiation; a radiation exit face extending parallel to a main plane of extension of the active region; a molding directly adjoins at least one side face of the semiconductor device at least one back of the semiconductor chip remote from the radiation exit face; a mounting surface provided to mount the semiconductor device; and a spacer projecting beyond the radiation exit face in a vertical direction extending perpendicular to the radiation exit face.

14 Claims, 6 Drawing Sheets

(51) Int. Cl.
  *H01L 33/58* (2010.01)
  *H01L 33/48* (2010.01)
  *H01L 33/62* (2010.01)
  *H01L 33/50* (2010.01)
  *H01L 33/54* (2010.01)

(52) U.S. Cl.
  CPC ........ *H01L 33/62* (2013.01); *H01L 2933/005* (2013.01); *H01L 2933/0041* (2013.01); *H01L 2933/0066* (2013.01)

(58) Field of Classification Search
  CPC ............... H01L 27/1266; G02F 1/1333; G02F 1/133305; G09G 5/003; G02G 2380/02
  See application file for complete search history.

(56) References Cited

U.S. PATENT DOCUMENTS

| | | | |
|---|---|---|---|
| 2007/0145393 A1 | 6/2007 | Darbinian et al. | |
| 2008/0061717 A1 | 3/2008 | Bogner et al. | |
| 2008/0105886 A1 | 5/2008 | Borner et al. | |
| 2008/0186714 A1 | 8/2008 | Nagayama | |
| 2009/0243078 A1* | 10/2009 | Lim | H01L 23/4334 257/690 |
| 2010/0019260 A1* | 1/2010 | Epler | H01L 33/0079 257/98 |
| 2011/0062469 A1* | 3/2011 | Camras | H01L 33/58 257/98 |
| 2011/0062471 A1* | 3/2011 | Bierhuizen | H01L 33/486 257/98 |
| 2011/0260178 A1* | 10/2011 | Bierhuizen | H01L 27/156 257/88 |
| 2012/0039064 A1* | 2/2012 | Ooyabu | H01L 33/507 362/84 |
| 2012/0068155 A1 | 3/2012 | Ishibashi | |
| 2013/0194165 A1* | 8/2013 | Tanaka | F21V 5/007 345/8 |
| 2013/0320380 A1 | 12/2013 | Kanemaru | |
| 2014/0175481 A1* | 6/2014 | Tischler | H01L 24/96 257/98 |
| 2014/0367633 A1* | 12/2014 | Bibl | G02F 1/133603 257/13 |

FOREIGN PATENT DOCUMENTS

| | | |
|---|---|---|
| DE | 10 2012 206 101 A1 | 10/2013 |
| DE | 10 2013 106 948 A1 | 1/2015 |
| TW | 200616263 A | 5/2006 |
| TW | 200620712 A | 6/2006 |

* cited by examiner

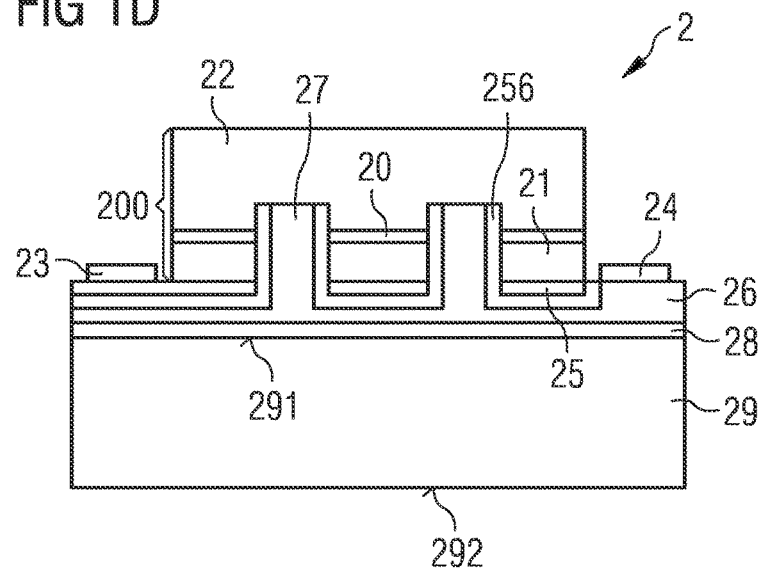
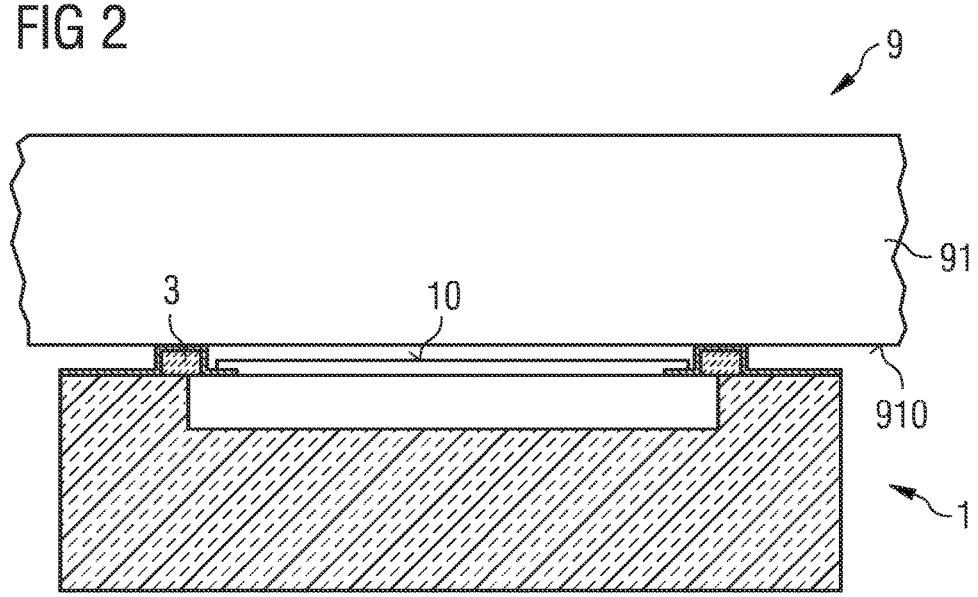

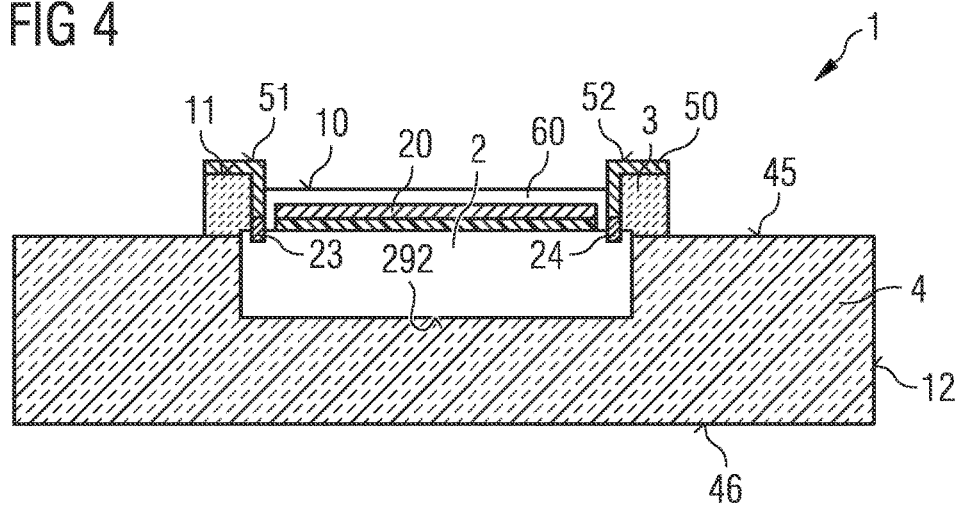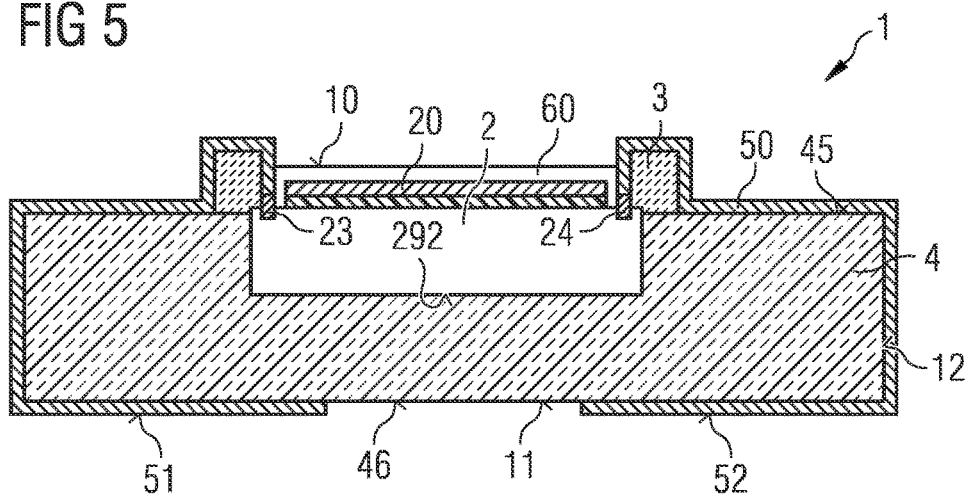

# SEMICONDUCTOR DEVICE, ILLUMINATING DEVICE, AND METHOD OF PRODUCING A SEMICONDUCTOR DEVICE

TECHNICAL FIELD

This disclosure relates to a semiconductor device, an illuminating device with a semiconductor device and a method of producing an optoelectronic semiconductor device.

BACKGROUND

Hand-held electronic equipment such as, for example, mobile radio devices often makes use of backlit liquid crystal displays. For this purpose, the radiation from a light source may be laterally coupled into a light guide. However, this requires precise positioning of light source and light guide since these need on the one hand to be arranged as close together as possible to achieve a compact design and good light incoupling. On the other hand, bright regions and color aberrations may occur at the edge of the light guide if the emission surface of the light source and the light guide come into contact.

It could therefore be helpful to simplify the relative positioning of light source and light guide during production of an illuminating device and provide a method with which a semiconductor device may be simply and inexpensively produced.

SUMMARY

We provide a semiconductor device including a semiconductor chip including an active region provided to generate radiation; a radiation exit face extending parallel to a main plane of extension of the active region; a molding molded in places onto the semiconductor chip and that, at least in places, forms at least one side face of the semiconductor device; a mounting surface provided to mount the semiconductor device; and a spacer projecting beyond the radiation exit face in a vertical direction extending perpendicular to the radiation exit face.

We also provide an illuminating device including at least one semiconductor device and a light guide, wherein, in operation, radiation exiting through the radiation exit face of the semiconductor device is coupled into a side face of the light guide, wherein the semiconductor device directly adjoins the light guide and the radiation exit face is spaced from the light guide.

We further provide a method of producing a plurality of semiconductor devices including:
a) providing a plurality of semiconductor chips that each have an active region provided to generate radiation;
b) encapsulating the semiconductor chips in places with a molding composition to form a molding assembly;
c) forming a spacer structure on the molding assembly; and
d) singulating the molding assembly into a plurality of semiconductor devices that each have a semiconductor chip and at least one spacer, wherein the spacer projects beyond a radiation exit face in a vertical direction extending perpendicular to the radiation exit face.

We yet further provide a semiconductor device including a semiconductor chip including an active region provided to generate radiation; a radiation exit face extending parallel to a main plane of extension of the active region; a molding molded in places onto the semiconductor chip and that, at least in places, forms at least one side face of the semiconductor device; a mounting surface provided to mount the semiconductor device; and a spacer projecting beyond the radiation exit face in a vertical direction extending perpendicular to the radiation exit face; wherein, when viewed in plan view onto the radiation exit face, the spacer covers the semiconductor chip in places and the spacer and the active region are arranged without overlap.

BRIEF DESCRIPTION OF THE DRAWINGS

FIG. 1D is a sectional view of an example of a semiconductor chip.

FIG. 2 is a schematic plan view of an example of an illuminating device.

FIGS. 4 and 5 each show a further example of a semiconductor device in schematic sectional view.

DETAILED DESCRIPTION

Figure 1A:
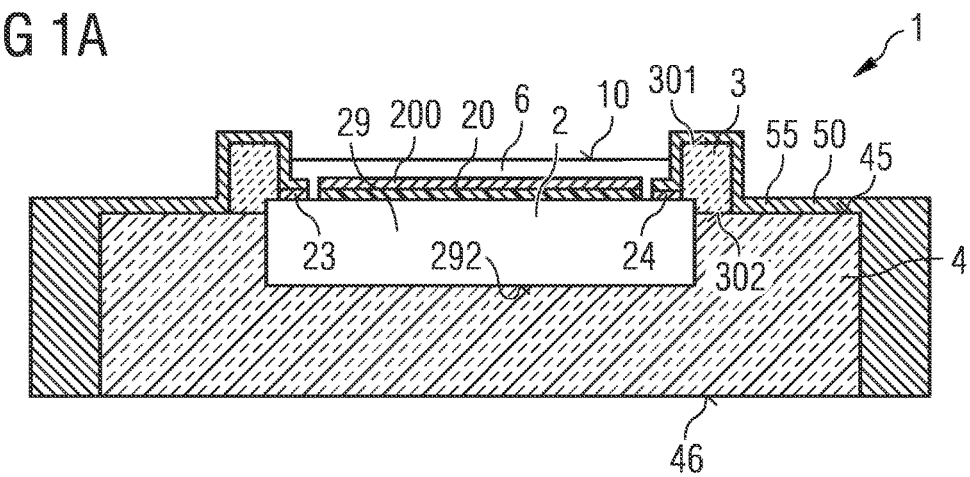
FIGS. 1A to 1C show an example of a semiconductor device in plan view (FIG. 1B), in associated sectional view (FIG. 1A) and in perspective representation (FIG. 1C).

Our semiconductor device may comprise at least one semiconductor chip provided to generate radiation. The at least one semiconductor chip comprises an active region provided to generate radiation. The active region is in particular provided to generate radiation in the visible, ultraviolet or infrared region of the spectrum. For example, the active region is part of a semiconductor body with a semiconductor layer sequence of the semiconductor device. For electrical contacting of the semiconductor chip, the semiconductor chip conveniently comprises a first contact and a second contact. For example, the semiconductor chip comprises two front contacts, wherein the front is considered to be that side at which emission takes place during operation.

The semiconductor device may comprise a radiation exit face. The radiation exit face is considered to be an outer face of the semiconductor device, wherein the radiation generated in the semiconductor chip during operation of the semiconductor device leaves the semiconductor device on passage through the radiation exit face. In other words, the radiation exit face forms an interface with the surroundings of the semiconductor device, for example, with air. The radiation exit face may be formed by the semiconductor chip or by a layer arranged on the semiconductor chip. The radiation exit face extends in particular parallel to a main plane of extension of the active region. In particular, the optoelectronic semiconductor device comprises precisely one radiation exit face.

The semiconductor device may comprise a mounting surface provided to mount the semiconductor device.

The semiconductor device, for example, takes the form of a surface-mounted device (SMD).

The semiconductor device may comprise a spacer. For example, in the vertical direction, the spacer has an extent of 15 µm to 500 µm, preferably 35 µm to 350 µm, particularly preferably 50 µm to 100 µm.

In particular, the spacer extends beyond the radiation exit face in a vertical direction extending perpendicular to the radiation exit face. The spacer is, for example, of electrically insulating construction. For example, the spacer contains a dielectric material, for instance polymer material. In the vertical direction the spacer extends, for example, between a back of the spacer and a front of the spacer. The radiation exit face is, for example, when viewed in the vertical direction, arranged between the front and the back of the spacer. Furthermore, the back of the spacer, when viewed in the vertical direction, extends between the back of the semiconductor chip and the radiation exit face. The spacer, for example, adjoins the semiconductor chip at least in places. In plan view onto the semiconductor device, the spacer and the radiation exit face are, for example, arranged side by side without overlap.

The semiconductor device may comprise a molding that directly adjoins the semiconductor chip. In particular, the molding adjoins at least one side face of the semiconductor chip, for example, onto two in particular opposing side faces or onto all the side faces of the semiconductor chip. At the points at which the molding adjoins the semiconductor chip, the molding in particular directly adjoins the semiconductor chip. The molding is, for example, configured in one piece. Furthermore, the molding is, for example, configured to be electrically insulating. The molding is in particular configured to be opaque to the radiation generated by the semiconductor chip when in operation. The molding in particular at least in places forms at least one side face of the semiconductor device. The molding may also form two or more, for example, also all the side faces of the semiconductor device. In case of doubt, the side faces mean those outer faces of the semiconductor device which extend obliquely or perpendicularly to the radiation exit face. In other words, the side faces extend between a back of the molding remote from the radiation exit face and a front of the molding opposite the back.

The semiconductor device may comprise a semiconductor chip with an active region provided to generate radiation. A radiation exit face of the semiconductor device extends parallel to a main plane of extension of the active region. The semiconductor device comprises a molding, which is molded in places onto the semiconductor chip and at least in places forms at least one side face of the semiconductor device. A mounting surface of the semiconductor device is provided to mount the semiconductor device. The semiconductor device comprises a spacer that projects beyond the radiation exit face in a vertical direction extending perpendicular to the radiation exit face.

By the spacer, it is ensured that even in an optical element, for example, a light guide arranged directly adjacent the semiconductor device, the radiation exit face is spaced therefrom. The spacer thus defines a minimum distance between radiation exit face and optical element. This minimum distance is simply and reliably adjustable during production of the semiconductor device in particular by way of the vertical extent of the spacer. In other words, the semiconductor device provides a limit stop for the optical element. During production of an illuminating device with such a semiconductor device and a light guide, it is thus possible to ensure, simply and reproducibly, that the light guide does not at any point directly adjoin the radiation exit face. The risk of radiation incoupling into the light guide at comparatively large angles and a resultant light guide edge with excessive brightness and/or color aberrations can thus be avoided.

The radiation exit face may extend perpendicular or substantially perpendicular to the mounting surface. Substantially perpendicular means a deviation of at most 10° from perpendicular orientation.

The spacer may project beyond the radiation exit face by at least 5 µm and at most 500 µm, preferably by at least 10 µm and at most 300 µm. In this region, an air gap is formed between the radiation exit face and an element adjoining the semiconductor device, for example, a light guide or an optical element, while at the same time maintaining a compact design.

The spacer may cover the semiconductor chip in places in plan view onto the radiation exit face. For example, a spacer completely covers at least one edge of the semiconductor chip. The spacer may also extend around the semiconductor chip in the manner of a frame and cover all four edges of the semiconductor chip.

The semiconductor device may also comprise more than one spacer. For example, the semiconductor device comprises two laterally spaced spacers which, for example, completely or at least in places cover opposing edges of the semiconductor chip.

The spacer and the active region may be arranged side by side and without overlap when viewed in plan view onto the radiation exit face. The spacer thus does not cause any shading of the active region. In particular, the spacer may also be radiation-opaque.

The spacer and the semiconductor chip may be arranged side by side and without overlap when viewed in plan view onto the radiation exit face. The spacer thus does not cover the semiconductor chip at any point when viewed in plan view onto the radiation exit face.

The molding may form the mounting surface. The mounting surface, for example, extends obliquely or perpendicularly to the radiation exit face.

The mounting surface may, however, also extend parallel to the active region. For example, the back of the molding forms the mounting surface.

At the radiation exit face of the semiconductor device, the semiconductor chip is conveniently completely or at least in places free of the molding. In plan view onto the radiation exit face, the semiconductor chip is thus not covered by the molding or covered only in places. The molding is in particular opaque to the radiation generated in the active region. For example, the molding is configured to be reflective for the radiation generated, for instance with a reflectivity of at least 60%, for example, at least 80%. However, the molding may also be transparent or at least translucent for the radiation.

The molding may cover a back of the semiconductor chip remote from the radiation exit face at least in places. In particular, the molding may cover the entire back of the semiconductor chip.

The radiation exit face may be formed by a radiation conversion element arranged on the semiconductor chip. The radiation conversion element is provided to convert primary radiation generated in the semiconductor chip wholly or at least in part into secondary radiation with a peak wavelength different from the primary radiation.

The radiation conversion element at least in places may directly adjoin the spacer. For example, the spacer laterally delimits the radiation conversion element on at least two sides or on all sides. In contrast thereto, the radiation conversion element may also be spaced from the spacer.

The semiconductor device may comprise a contact structure. The contact structure electrically conductively connects with the semiconductor chip. For example, the contact structure comprises a first contact area and a second contact area for external electrical contacting of the semiconductor device. In particular, the first contact area and the second contact area are accessible on the mounting surface. The contact structure is in particular arranged on the molding, for example, on the front of the molding. For example, the contact structure takes the form of an electrically conductive, for instance metallic coating.

The contact structure may be guided over the spacer. The contact structure thus extends in places on the side of the spacer remote from the back of the semiconductor device. In particular, the spacer is arranged in the vertical direction in places between the semiconductor chip and the contact structure, in particular at the edge of the semiconductor chip. The spacer makes it possible simply and reliably to avoid the risk of an electrical short-circuit by the contact structure at the edge of the semiconductor chip.

The first contact area and the second contact area may be formed on the spacer. The spacer may in particular form the mounting surface.

In plan view onto the radiation exit face, the semiconductor device may have a rectangular basic shape with at least one indentation. In particular, the contact structure covers a side face of the indentation at least in places. For example, for electrical contacting, at least one of the side faces is accessible from the mounting surface. The semiconductor device may also comprise a plurality of such indentations. The indentation, for example, substantially takes the form of part of an ellipse or of a circle. Such indentations are simple to produce. Another basic shape for the indentation may, however, also be used. The at least one indentation is formed, for example, at the edge or in a corner of the rectangular basic shape. The regions of the rectangular basic shape extending straight in plan view are in particular free of the material of the contact structure.

An illuminating device may comprise at least one semiconductor device and one light guide, wherein the semiconductor device comprises at least one of the above-described features. When in operation, radiation exiting through the radiation exit face of the semiconductor device is, for example, coupled into a side face of the light guide. The illuminating device is, for example, provided to backlight a display device, for instance a liquid crystal display device (LCD). The illuminating device is arranged, for example, in an electronic device, in particular a mobile electronic device, for instance a mobile telephone or a mobile computer. The illuminating device may also comprise more than one such semiconductor device.

The semiconductor device may directly adjoin the light guide and the radiation exit face may be spaced from the light guide. The distance between the radiation exit face and the light guide is thus—apart from a coating applied to the spacer, for instance a contact structure—predetermined by how far the spacer projects beyond the radiation exit face in the vertical direction.

Our method of producing a semiconductor device may comprise a step in which a plurality of semiconductor chips are provided which each have an active region provided to generate radiation.

The method may comprise a step in which the semiconductor chips are encapsulated in places with a molding composition to form a molding assembly. Encapsulation may proceed, for example, by a casting method, wherein casting method in general denotes a method of applying a molding composition and in particular encompasses injection molding, transfer molding, compression molding and casting.

The method may comprise a step in which a spacer structure is formed on the molding assembly. During formation of the spacer structure, the semiconductor chips are thus already encapsulated by the molding assembly. In particular, the spacer structure projects beyond the semiconductor chips in a vertical direction extending perpendicular to the radiation exit face. The spacer structure may, for example, be applied by a casting method or printing.

The method may comprise a step in which the molding assembly is singulated into a plurality of semiconductor devices, wherein a side face of the singulated molding arising on singulation, for example, forms a mounting surface of the semiconductor device. Singulation may, for example, proceed by a mechanical method, for example, sawing, or by coherent radiation, for instance by laser cutting.

A plurality of semiconductor chips may be provided which each have an active region provided to generate radiation. The semiconductor chips are encapsulated in places with a molding composition to form a molding assembly. A spacer structure is formed on the molding assembly. The molding assembly is singulated into a plurality of semiconductor devices which each have a semiconductor chip and at least one spacer, wherein the spacer projects beyond the radiation exit face in a vertical direction extending perpendicular to the radiation exit face.

The spacer assembly may form at least one cavity that overlaps with one of the semiconductor chips. The cavity is filled with a radiation conversion material. When viewed in plan view onto the spacer assembly, the cavity may precisely surround one semiconductor chip or a plurality of semiconductor chips. In a matrix-like arrangement of the semiconductor chips with rows and columns, one cavity, for example, in each case surrounds all the semiconductor chips of one row or all the semiconductor chips of one column.

The method may comprise a step in which a coating, in particular an electrically conductive coating, is formed on the molding assembly to electrically contact the semiconductor chips. The coating is configured in patterned manner to contact the semiconductor chips, i.e. not over the entire surface. The coating may, for example, be formed by vapor deposition or sputtering. In a subsequent step, the thickness of the electrically conductive coating may be increased, in particular to increase electrical conductivity, for example, by electrodeposition or electroless deposition.

Formation of the coating proceeds in particular only after formation of the spacer structure. The coating may cover the spacer structure in places.

Singulation proceeds in particular only after application of the coating such that the regions of the side faces of the semiconductor devices arising on singulation are free of coating material.

Prior to formation of the coating the molding assembly may comprise a recess at least between two adjacent semiconductor chips, which recess is provided with the coating. The recesses may extend completely or only in part through the molding assembly. The molding assembly may be configured such that the molding assembly already comprises the recesses. Alternatively, the recesses may be introduced into the molding assembly by material removal after formation of the molding assembly and prior to application of the coating, for example, by coherent radiation or mechanically, for instance by drilling.

In particular, the recesses are divided on singulation of the molding assembly. For example, singulation proceeds such that the singulated semiconductor devices have a rectangular basic shape with at least one indentation. In particular, the semiconductor devices may have an indentation or a plurality of indentations at one corner or at a plurality of corners and/or on the mounting surface.

The above-described method is particularly suitable for producing a semiconductor device described further above.

Features listed in connection with the semiconductor device may therefore also be used for the method and vice versa.

In the method, the mounting surface and moreover also the side face of the semiconductor device opposite the mounting surface may arise during the singulation step. The component height, i.e. the extent vertically relative to the mounting surface, is thus determined by the distance between parallel dividing lines during the singulation step and can therefore also adopt particularly low values. In particular, the component height may be greater than or equal to 100 µm and less than or equal to 600 µm. The component height preferably amounts to 200 µm to 400 µm. In this way, a particularly compact semiconductor device may be provided which, when in operation, makes available a sufficient luminous flux.

The moldings may be formed over a large area for a multiplicity of semiconductor devices in a common singulation step. In this case, the individual moldings in particular only arise after the semiconductor chips have already been arranged within the molding to be produced. The semiconductor chips do not therefore have to be placed and electrically contacted in prefabricated packages. Rather, the molding forming the package is formed only by singulation of the molding assembly with the semiconductor chips embedded therein. The side faces arising during production of the semiconductor device, for example, also a mounting surface formed by a side face, may comprise singulation traces, for example, sawing traces or traces of a laser separation method.

Further convenient aspects are revealed by the following description of the examples in conjunction with the figures.

Identical, similar or identically acting elements are provided with identical reference numerals in the figures.

The figures are schematic representations and therefore not necessarily true to scale. Rather, comparatively small elements and in particular layer thicknesses may be illustrated on an exaggeratedly large scale for clarification.

Figure 1B:
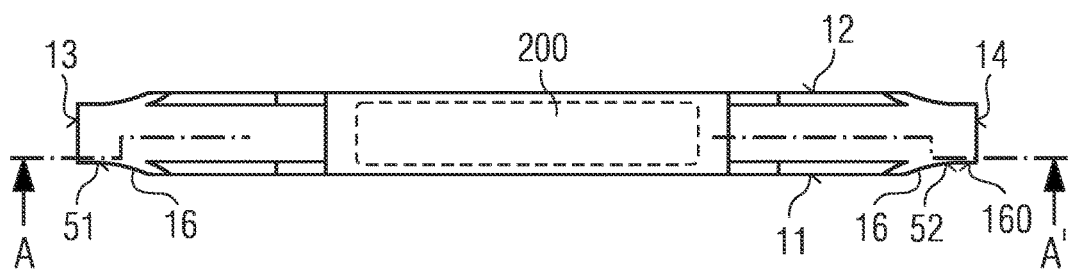
Figure 1C:
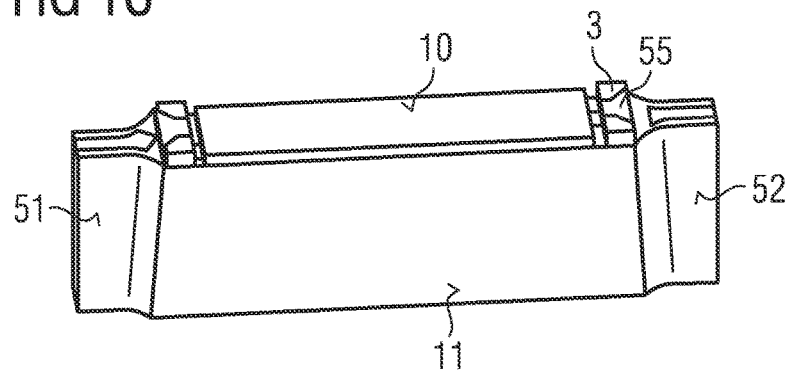

A first example of a semiconductor device 1 is shown in plan view in FIG. 1B and in sectional view along line AA' in FIG. 1A. The term "plan view" relates hereinafter to a plan view onto that side of the semiconductor device on which a radiation exit face 10 of the semiconductor device 1 is arranged, if not explicitly stated otherwise.

The semiconductor device 1 comprises a semiconductor chip 2 provided to generate electromagnetic radiation when the semiconductor device is in operation.

The radiation exit face 10 extends parallel to a main plane of extension of the active region 20 of the semiconductor chips 2. In the example shown, the radiation exit face is formed by a radiation conversion element 6 arranged on the semiconductor chip. Primary radiation generated in the semiconductor chip, for example, in the blue region of the spectrum or in the infrared region of the spectrum, may be partially or completely converted into secondary radiation by the radiation conversion element such that, in operation, the semiconductor device generates mixed light which overall appears white to the human eye. However, such a radiation conversion element is not absolutely necessary. In this case, the semiconductor chip 2 may itself form the radiation exit face 10.

The semiconductor device 1 further comprises a spacer 3. In the vertical direction the spacer extends between a front 301 and a back 302. The front is considered to be the emission-side surface of the spacer. The spacer projects beyond the radiation exit face 10 in the vertical direction. When viewed in the vertical direction, the radiation exit face 10 extends between the front and the back of the spacer 3.

For example, the spacer projects beyond the radiation exit face by at least 5 µm and at most 500 µm, preferably by at least 10 µm and at most 300 µm. Furthermore, the back 302 of the spacer, when viewed in the vertical direction, extends between the back 292 of the semiconductor chip and the radiation exit face 10.

For example, in the vertical direction the spacer has an extent of 20 µm to 500 µm, preferably 35 µm to 350 µm, particularly preferably 50 µm to 100 µm. In particular, the vertical extent of the radiation conversion element 6 and the vertical extent of the spacer are conformed to one another such that the spacer projects beyond the radiation conversion element. In a configuration of the semiconductor device 1 without a radiation conversion element, the spacer may be configured to be correspondingly thinner.

The radiation conversion element 6 directly adjoins the spacer 3. In particular, the spacer 3 delimits the lateral extent of the radiation conversion element. Production of the radiation conversion element is thereby simplified. In contrast thereto, the radiation conversion element 6 may, however, also be arranged at a distance from the spacer.

The semiconductor device 1 further comprises a molding 4, which adjoins the semiconductor chip 2 and in places directly adjoins the semiconductor chip. In the vertical direction, i.e. perpendicular to the radiation exit face 10, the molding extends between a front 45 facing the radiation exit face 10 and a back 46 remote from the front.

The molding adjoins all four side faces of the semiconductor chip. The semiconductor chip 2 is moreover covered with material of the molding on a back 292 remote from the radiation exit face 10. A front of the semiconductor chip 2 opposite the back 292 is free of molding 4 material.

The molding 4 may contain a polymer material or consist of such a material. For example, the polymer material may contain an epoxide, a silicone, PPA or polyester. The polymer material may in particular be filled with inorganic particles, for example, to increase the reflectivity of the material of the molding and/or to adjust the coefficient of thermal expansion. The particles may, for example, contain glass, $TiO_2$, $Al_2O_3$ or ZrO or consist of such a material.

In plan view, the spacer 3 covers the semiconductor chip 2 and the molding 4 in places. The spacer additionally adjoins the semiconductor chip 2 in places. In particular, the spacer 3 extends over an edge delimiting the semiconductor chip 2 in the lateral direction. The spacer may in this way at the same time serve in simplified electrical contacting of the semiconductor chip 2. In particular, the semiconductor chip is contacted by planar contacting, i.e. contacting which is free of wire bond connections.

In contrast thereto, however, the spacer may also be arranged laterally of the semiconductor chip 2 when viewed in plan view onto the radiation exit face.

In plan view, the semiconductor device 1 extends in a longitudinal direction between a first end face 13 and a second end face 14.

The semiconductor device 1 comprises side faces 12 that join the front 45 to the back 46. One of the side faces takes the form of a mounting surface 11. On mounting on a connection carrier, for example, a printed circuit board or a package part, the mounting surface takes the form of a bearing face such that radiation emitted perpendicularly through the radiation exit face 10 extends parallel to the major face of the connection carrier.

The semiconductor device comprises two spacers 3 that each extend along one edge of the semiconductor chip and, in plan view, from the mounting surface 11 to the opposing side face 12. In contrast thereto, however, another geometric configuration and/or arrangement of the spacer may also be convenient. For example, a spacer may also be provided that extends around the semiconductor chip 2 in the manner of a frame.

The semiconductor device 1 further comprises a contact structure 50. The contact structure comprises a first contact area 51 and a second contact area 52. The first contact area and the second contact area are provided for external electrical contact of the semiconductor device 1. The contact areas are accessible from the mounting surface 11 for external electrical contact. The semiconductor device 1 is, moreover, configured as a surface-mounted device. At the first end face 13 and at the second end face 14, the semiconductor devices each comprise an indentation 16 on the side facing the mounting surface 11. One side face 160 of the indentations is provided with the contact structure. These side faces form the first contact area 51 and the second contact area 52.

A first contact 23 and a second contact 24 of the semiconductor chip each electrically conductively connect respectively to the first contact area 51 and the second contact area 52 via a contact track 55. The contact tracks form planar contacting for the semiconductor chip. At the edges of the semiconductor chip over which the contact tracks are guided, the contact track extends on the spacer 3. When viewed in the vertical direction, the spacer 3 is thus arranged between the edge of the semiconductor chip and the contact structure 50. The spacer serves at the same time in avoiding an electrical short-circuit between the contact tracks and regions of the semiconductor chip 2 not to be electrically contacted.

The back 46 of the molding 4 is free of the contact structure. Back machining of the molding for contacting purposes is thus not necessary.

FIG. 1D shows an example of a particularly suitable semiconductor chip. The semiconductor chip 2 comprises a semiconductor body with a semiconductor layer sequence 200 arranged on a carrier 29. The semiconductor body with the semiconductor layer sequence comprises an active region 20 provided to generate radiation. The active region 20 is arranged between a first semiconductor layer 21 and a second semiconductor layer 22, wherein the first semiconductor layer 21 and the second semiconductor layer 22 differ from one another at least in places with regard to charge type such that the active region 20 is located in a pn junction. For example, the first semiconductor layer is p-conductive and the second semiconductor layer n-conductive or vice versa. The first semiconductor layer 21 is arranged between the active region 20 and the carrier 29.

The semiconductor chip shown in FIG. 1D takes the form of a thin-film semiconductor chip in which a growth substrate for in particular epitaxial deposition of the semiconductor layer sequence 200 of the semiconductor body is removed and the carrier 29 mechanically stabilizes the semiconductor layer sequence 200. The semiconductor layer sequence 200 is fastened to the carrier 29 by a bonding layer 28, for example, a solder layer or an adhesive layer.

The first semiconductor layer electrically conductively connects to the first contact 23 via a first connection layer 25. The first connection layer extends in places between the first semiconductor layer 21 and the carrier 29. The first connection layer or at least one sublayer thereof is in particular configured as a mirror layer for the radiation generated in the active region 20. The first connection layer contains silver, aluminum, palladium or rhodium or a metal alloy with at least one of the stated materials, for example.

The semiconductor body with the semiconductor layer sequence 200 comprises a plurality of recesses 27 that extend through the first semiconductor layer 21 and the active region 20 into the second semiconductor layer 22. In the recesses 27, the second semiconductor layer 22 electrically conductively connects via a second connection layer 26 to the second contact 24. When viewed in a vertical direction, the first connection layer 25 extends in places between the second connection layer 26 and the semiconductor layer sequence 200. The first contact 23 and the second contact 24 are each formed on the front 291 of the carrier 29. The contacts are arranged laterally of the semiconductor body with the semiconductor layer sequence 200. Shading of the active region 20 by metallic layers for electrical contact can be avoided in this way. The semiconductor chip 2 further comprises an insulation layer 256 to prevent an electrical short-circuit between the first connection layer 25 and the second connection layer 26.

Alternatively, a semiconductor chip may also be used in which the carrier is formed by the growth substrate 29. A bonding layer between semiconductor layer sequence 200 and carrier 29 is thus not necessary.

The semiconductor chip 2 may, as shown in FIG. 1D, project vertically out of the molding 4. This is a simple way of ensuring that the semiconductor chip is free of molding 4 material on the emission side. However, the semiconductor chip may also terminate flush with the molding or, when viewed in the vertical direction, end below the front 45 of the molding 4.

During production of the semiconductor device 1, the side faces 12, in particular the mounting surface 11, the first end face 13 and the second end face 14 arise on singulation of an assembly into the semiconductor devices. The side faces may therefore at least in places have singulation traces, for example, sawing traces or traces of a laser cutting method.

Compared to a semiconductor device in which semiconductor chips are placed in a prefabricated package, the molding 4 arises during production as a result of molding-on of a molding composition onto the semiconductor chip 2. In this way, a particularly compact design may be achieved.

The transverse extent of the semiconductor device 1 perpendicular to the longitudinal direction when viewed in plan view onto the radiation exit face 10, is preferably greater by at most 50%, particularly preferably by at most 30%, than the extent of the semiconductor chip 2 in this direction. On mounting of the semiconductor device on the mounting surface 11, the transverse extent corresponds to the height of the semiconductor device. The height of the semiconductor device 1 preferably amounts to 0.1 mm to 1 mm, preferably to 0.2 mm to 0.6 mm.

The dimensions of the semiconductor device 1 may also be particularly small in the vertical direction. For example, the vertical extent amounts to 0.1 mm to 2 mm, particularly preferably to 0.5 mm to 1.5 mm. When using such a semiconductor device for incoupling into a light guide, the space requirement laterally of the light guide may be minimized while at the same time achieving good incoupling characteristics. This is described in greater detail in relation to FIG. 2.

FIG. 2 shows an example of an illuminating device 9. The illuminating device is, for example, provided for an electronic device, for instance a mobile telephone or a mobile computer. The illuminating device 9 comprises a semiconductor device 1 that may be configured as described in relation to FIGS. 1A to 1D. The illuminating device 9 further comprises a light guide 91 to backlight a display device, for instance a liquid crystal display, wherein, when the illuminating device is in operation, the radiation emitted by the semiconductor chip 2 is incoupled through a side face 910 of the light guide. The spacer 3 or optionally a layer arranged on the spacer, for example, the contact structure 50, forms a limit stop for the light guide 91 during production of the illuminating device. An air gap is formed between the side face 910 and the radiation exit face 10. This prevents radiation from being coupled into the light guide 91 at comparatively large angles and coupled out therefrom again in the vicinity of the side face without preceding deflection within the light guide. In this way, a too bright edge or color aberrations at the edge of the light guide may be prevented. In contrast to a semiconductor device without such a spacer, it is thus unnecessary, in production of the illuminating device 9, to provide any spacing for this purpose between the semiconductor device and the light guide. The illuminating device may, of course, also comprise two or more semiconductor devices 1 that incouple into the light guide 91.

An example of a method of producing semiconductor devices is shown in FIGS. 3A to 3I, wherein FIGS. 3B, 3D, 3F, 3H and 3I show a plan view onto the subsequent radiation exit face. FIGS. 3A, 3C, 3E and 3G show associated sectional views.

Figure 3A:
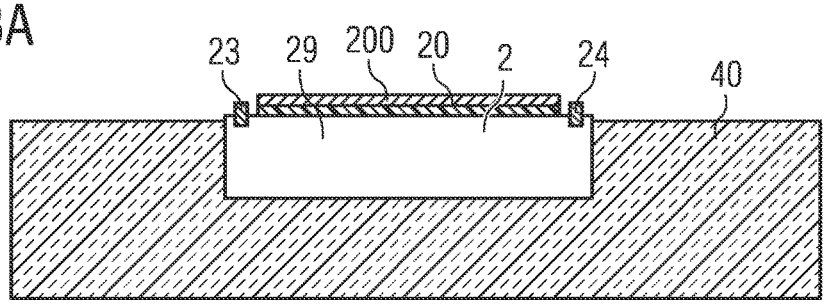
FIGS. 3A to 3I show an example of a method of producing semiconductor devices on the basis of intermediate steps shown in schematic plan view.
Figure 3B:
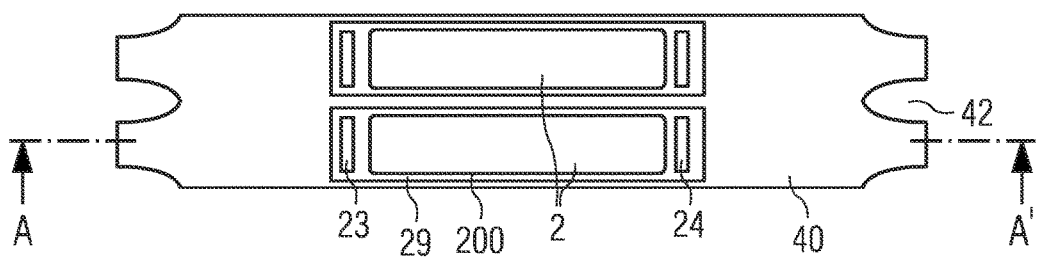

As shown in FIGS. 3A and 3B, a plurality of semiconductor chips 2 are provided, for example, on an auxiliary carrier, for instance a film or a rigid carrier. The semiconductor chips are arranged, for example, in rows and columns in the form of a matrix. To simplify the illustrations, the figures show a portion comprising two rows and one column.

The semiconductor chips 2 each comprise a semiconductor body with a semiconductor layer sequence 200. An active region 20 provided to generate radiation is arranged in the semiconductor layer sequence. The semiconductor chips 2 each comprise a first contact 23 and a second contact 24, preferably laterally of the semiconductor bodies with the semiconductor layer sequence 200.

The semiconductor chips 2 are encapsulated by a molding composition to form a molding assembly 40. A casting method is suitable for this purpose, for example. The front of the semiconductor chips remains free of the molding composition.

The molding assembly 40 is configured to comprise recesses 42. The recesses 42 preferably extend right through the molding assembly 40 in a vertical direction. The recesses may be formed as early as during formation of the molding assembly, for instance by a corresponding casting mold, or subsequently in the molding assembly, for example, mechanically, chemically or by coherent radiation.

Figure 3C:
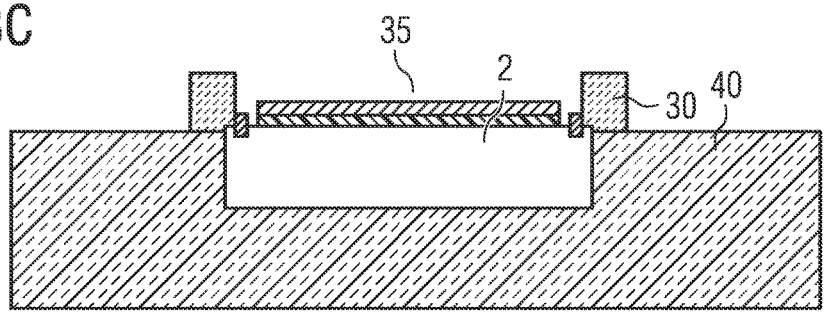
Figure 3D:
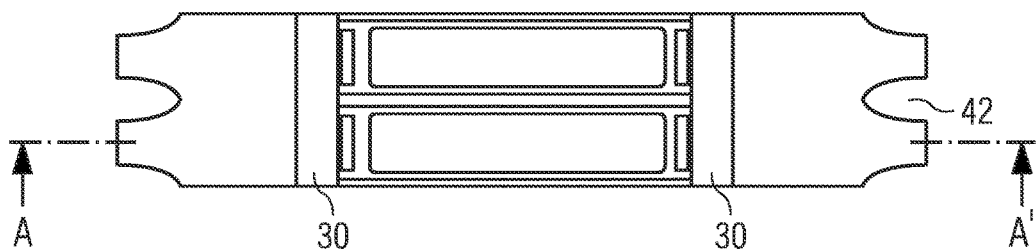

As shown in FIGS. 3C and 3D, a spacer structure 30 is then formed, for example, by a casting method or printing. The spacer structure, for example, contains a polymer material, for instance a silicone or an epoxide. The spacer structure 30 directly adjoins the molding assembly 40. On formation of the spacer structure 30, the semiconductor chips 2 are thus already embedded in the molding assembly.

The spacer structure 30 extends in strips over the molding assembly 40 between the columns of semiconductor chips 2. In plan view, the strips extend over the edges of the semiconductor chips 2, so in each case covering the molding assembly and parts of the semiconductor chips. The semiconductor bodies 200 with the active regions 20 remain free of the spacer structure 30. The risk of shading of the active regions is thereby avoided. Two strips of the spacer structure extending along opposing edges of the semiconductor chips 2 form a cavity 35 above the respective semiconductor chips. The semiconductor chips 2 arranged in one column are each associated with one cavity. In contrast thereto, the spacer structure may, however, also each form frames surrounding individual semiconductor chips such that a separate cavity 35 is associated with each semiconductor chip.

Figure 3E:
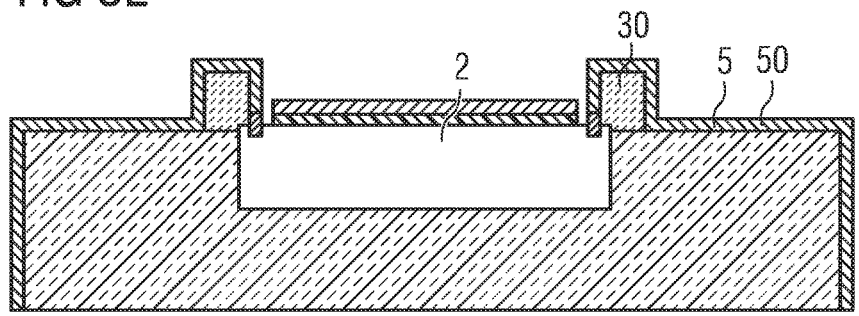
Figure 3F:
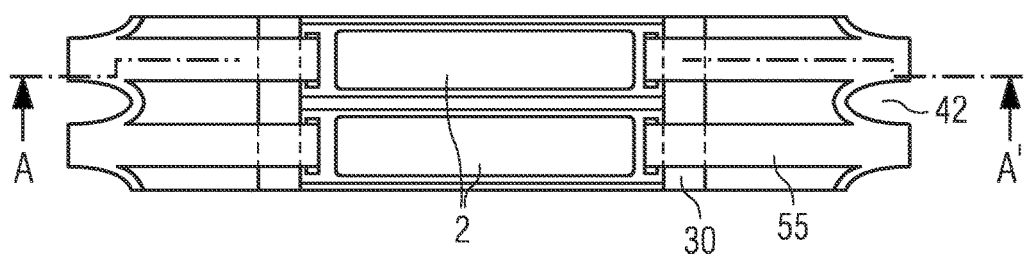

A coating 5 is applied for electrical contact of the semiconductor chips (FIGS. 3E and 3F). The coating 5 may, for example, be applied by vapor deposition or sputtering and optionally subsequently made thicker, for example, by electrodeposition. The molding assembly is provided with the coating solely from the front. The coating also covers the side faces of the recesses 42 and there forms externally accessible contact areas in the finished semiconductor device. Contact tracks 55 of the contact structure 50 are guided over the edges of the semiconductor chips 2 covered by the spacer structure 30. These contact tracks form planar contacting of the semiconductor chips 2. Between the edges of the semiconductor chips and the contact tracks the spacer structure is formed in the vertical direction. In this way, the spacer structure at the same time fulfills the function of electrically insulating the contact tracks from regions of the semiconductor chips not to be electrically contacted. Electrical contacting of the semiconductor chips 2 by the contact structure 50 thus takes place only after formation of the spacer structure 30.

Figure 3G:
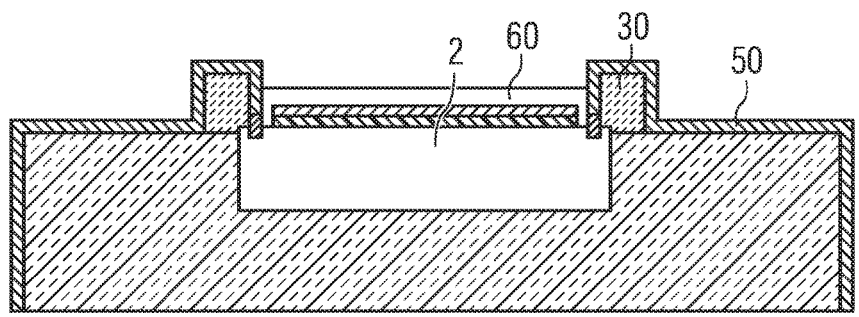
Figure 3H:
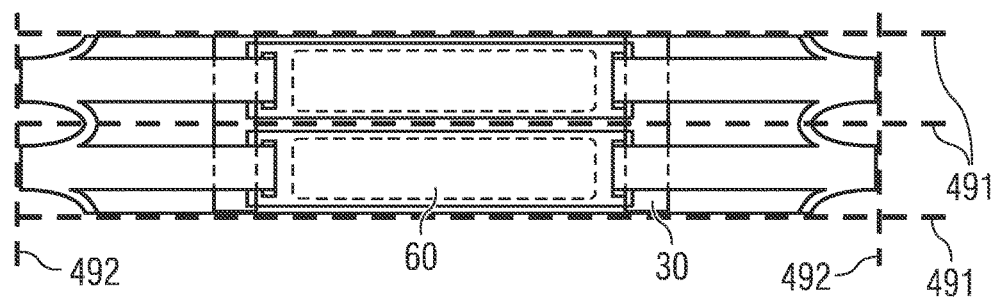

A radiation conversion material 60 is then applied to the semiconductor chips 2 (FIGS. 3G and 3H). The spacer structure 30 with the cavities 35 may serve as a casting mold in this respect. The radiation conversion material may in particular be applied in liquid form. Alternatively, the radiation conversion material may, for example, be applied by spray coating, for instance through a shadow mask. In this case, the spacer structure may support the shadow mask. The risk of spray penetration or creepage under the shadow mask can thus be avoided or at least reduced by the spacer structure.

The radiation conversion elements 6 arising on subsequent singulation directly adjoin the spacers 3. The cavities 35 are only partly filled with the radiation conversion material such that the spacer structure 30 projects vertically beyond the radiation conversion material 60.

Figure 3I:
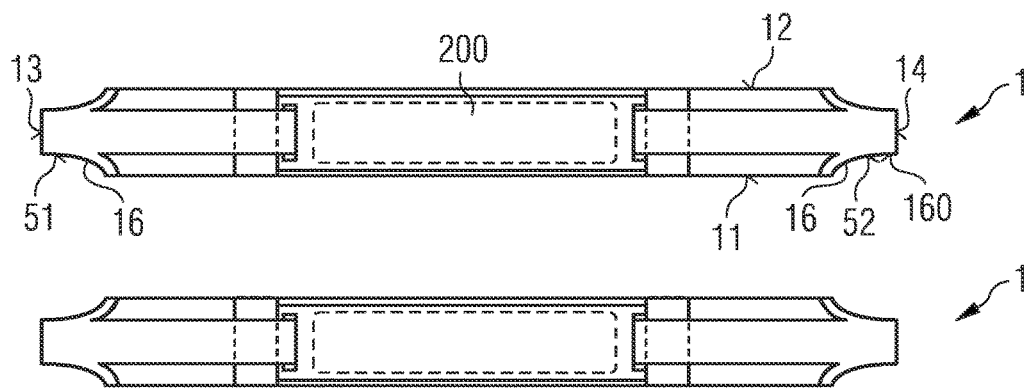

To form the individual semiconductor devices 1, the molding assembly 40 is singulated along first dividing lines 491 and second dividing lines 492 extending perpendicular thereto (FIG. 3H). The singulated semiconductor devices are shown in FIG. 3I. Singulation produces the side faces of the semiconductor devices 1, in particular the mounting surface 11 and the side face 12 opposite the mounting surface. The structural height of the semiconductor devices 1 is thus predetermined on production of the semiconductor devices by the center-to-center distance of the first dividing lines 491 and the trace width on singulation.

Singulation may proceed mechanically, for example, by sawing, chemically, for example, by wet chemical or dry chemical etching, or by coherent radiation.

Singulation proceeds as shown in FIG. 3H such that singulation along the first dividing lines 491 and/or along the second dividing lines 492 extends through the recesses 42. In FIG. 3H, the first dividing lines and the second dividing lines 492 extend by way of example through the recesses 42 such that, in plan view, the semiconductor devices have a rectangular basic shape with in each case an indentation 16 in the corners formed by the recess 42.

On singulation, the spacer structure 30 is also divided. The resultant spacer 3 extends over the entire component height of the semiconductor device, i.e. from the mounting surface 11 to the opposing side face 12.

Furthermore, on singulation the radiation conversion material 60 is also divided. The resultant radiation conversion elements 6 and thus the radiation exit faces 10 extend over the entire component height of the semiconductor device.

Using the method described, it is simply and reliably possible to produce semiconductor devices distinguished by a particularly compact design, in particular a small structural height, and at the same time allow efficient incoupling of comparatively high radiant power even into thin light guides. The minimum distance between the radiation exit face 10 and an element arranged downstream of the semiconductor device in the emission direction, for example, a light guide, is predetermined in particular by the spacers 3 as early as during singulation into semiconductor devices. The spacer 3 or a layer arranged on the spacer 3, for example, the contact structure 50, may thus serve as a limit stop for relative positioning of semiconductor device and optical element.

FIG. 4 shows a further example of a semiconductor device in schematic sectional view. This example substantially corresponds to the example described in connection with FIGS. 1A to 1D. In contrast thereto, the mounting surface 11 extends parallel to the active region 20. The mounting surface is formed by the spacers 3. The first contact area 51 and the second contact area 52 are each arranged on a spacer. In this example the semiconductor device is thus electrically contactable on the emission side. In this example the side faces 12 of the molding 4 may be completely free of the contact structure 50.

FIG. 5 shows a further example of a semiconductor device in schematic sectional view. This example substantially corresponds to the example described in connection with FIG. 4. In particular, the mounting surface 11 extends parallel to the active region 20. However, the semiconductor device is electrically contactable via the first contact area 51 and the second contact area 52 on the side remote from the radiation exit face 10. The mounting surface is formed by the back 46 of the molding. The mounting surface 11 and the radiation exit face 10 are thus opposing surfaces of the semiconductor device 1.

This application claims priority of DE 10 2014 110 719.5, the subject matter of which is hereby incorporated by reference.

Our devices and methods are not restricted by the description given with reference to the examples. Rather, this disclosure encompasses any novel feature and any combination of features, including in particular any combination of features in the appended claims, even if the feature or combination is not itself explicitly indicated in the claims or the examples.

The invention claimed is:

1. A semiconductor device comprising:
a semiconductor chip comprising an active region provided to generate radiation;
a radiation exit face extending parallel to a main plane of extension of the active region;
a molding directly adjoining at least one side face of the semiconductor chip and at least one back of the semiconductor chip remote from the radiation exit face; and
a spacer projecting beyond the radiation exit face in a vertical direction extending perpendicular to the radiation exit face,
wherein the spacer and the active region are arranged side by side and without overlap when viewed in a plan view onto the radiation exit face.

2. The semiconductor device according to claim 1, wherein the spacer projects beyond the radiation exit face by at least 5 μm and at most 500 μm.

3. The semiconductor device according to claim 1, wherein the molding covers a back of the semiconductor chip remote from the radiation exit face at least in places.

4. The semiconductor device according to claim 1, wherein the radiation exit face is formed by a radiation conversion element arranged on the semiconductor chip.

5. The semiconductor device according to claim 4, wherein the radiation conversion element at least in places directly adjoins the spacer.

6. The semiconductor device according to claim 1, wherein
the semiconductor device comprises a contact structure electrically conductively connected to the semiconductor chip;
the contact structure comprises a first contact area and a second contact area for external electrical contacting of the semiconductor device; and
the first contact area and the second contact area are accessible on the mounting surface.

7. The semiconductor device according to claim 6, wherein the contact structure is guided over the spacer.

8. The semiconductor device according to claim 6, wherein the first contact area and the second contact area are formed on the spacer.

9. The semiconductor device according to claim 6, wherein, in a plan view onto the radiation exit face, the semiconductor device has a rectangular basic shape with at least one indentation, and the contact structure covers a side face of the indentation at least in places.

10. The semiconductor device according to claim 1, wherein the molding forms the mounting surface and the mounting surface extends obliquely or perpendicularly to the radiation exit face.

11. The semiconductor device according to claim 1, wherein the mounting surface extends parallel to the active region.

12. An illuminating device comprising at least one semiconductor device according to claim 1 and a light guide, wherein, in operation, radiation exiting through the radiation exit face of the semiconductor device is coupled into a side face of the light guide.

13. The illuminating device according to claim 12, wherein the semiconductor device directly adjoins the light guide and the radiation exit face is spaced from the light guide.

14. A semiconductor device comprising:
a semiconductor chip comprising an active region provided to generate radiation;
a radiation exit face extending parallel to a main plane of extension of the active region;
a molding directly adjoining at least one side face of the semiconductor chip and at least one back of the semiconductor chip remote from the radiation exit face;
a mounting surface;
a spacer projecting beyond the radiation exit face in a vertical direction extending perpendicular to the radiation exit face, wherein the spacer covers the semiconductor chip in places when viewed in a plan view onto the radiation exit face;
a contact structure electrically conductively connected to the semiconductor chip, wherein
the contact structure comprises a first contact area and a second contact area for external electrical contacting of the semiconductor device, and the semiconductor device satisfies one of i through iii:
i. the first contact area and the second contact area are accessible on the mounting surface, wherein the contact structure is guided over the spacer, or
ii. the first contact area and the second contact area are formed on the spacer, or
iii. the first contact area and the second contact area are accessible on the mounting surface, and in plan view onto the radiation exit face, the semiconductor device has a rectangular basic shape with at least one indentation, wherein the contact structure covers a side face of the indention at least in places.

\* \* \* \* \*